(12) United States Patent
Hamada

(10) Patent No.: US 8,808,582 B2
(45) Date of Patent: Aug. 19, 2014

(54) LOW-MELTING-POINT GLASS COMPOSITION AND CONDUCTIVE PASTE MATERIAL USING SAME

(75) Inventor: Jun Hamada, Matsusaka (JP)

(73) Assignee: Central Glass Company, Limited, Ube-shi (JP)

(*) Notice: Subject to any disclaimer, the term of this patent is extended or adjusted under 35 U.S.C. 154(b) by 0 days.

(21) Appl. No.: 13/634,727

(22) PCT Filed: Jun. 14, 2011

(86) PCT No.: PCT/JP2011/063590
§ 371 (c)(1),
(2), (4) Date: Sep. 13, 2012

(87) PCT Pub. No.: WO2012/002143
PCT Pub. Date: Jan. 5, 2012

(65) Prior Publication Data
US 2013/0119326 A1    May 16, 2013

(30) Foreign Application Priority Data
Jun. 29, 2010   (JP) ................... 2010-147806

(51) Int. Cl.
*H01B 1/16* (2006.01)
*C03C 8/18* (2006.01)

(52) U.S. Cl.
USPC ............................... 252/512; 501/21; 501/77

(58) Field of Classification Search
CPC ............ H01B 1/16; H05K 1/092; C02C 8/02; C02C 8/18; C02C 3/064
USPC ................. 252/512–514; 501/21, 32, 77
See application file for complete search history.

(56) References Cited

U.S. PATENT DOCUMENTS

| | | | | |
|---|---|---|---|---|
| 4,400,214 A * | 8/1983 | Ogawa et al. | ................. | 106/1.13 |
| 5,376,596 A * | 12/1994 | Tokuda et al. | ................. | 501/19 |
| 5,840,216 A * | 11/1998 | Ohtani et al. | ................. | 252/514 |
| 5,998,037 A * | 12/1999 | Sridharan et al. | ............. | 428/472 |
| 6,362,119 B1 * | 3/2002 | Chiba | ............. | 501/15 |
| 6,663,798 B2 * | 12/2003 | Sato et al. | ................. | 252/512 |
| 2006/0272700 A1 | 12/2006 | Young et al. | | |

FOREIGN PATENT DOCUMENTS

| | | |
|---|---|---|
| JP | 57-38343 A | 3/1982 |
| JP | 5-58669 A | 3/1993 |
| JP | 2001-139345 A | 5/2001 |
| JP | 2001-163635 A | 6/2001 |
| JP | 2001-172046 A | 6/2001 |
| JP | 2003-165744 A | 6/2003 |

(Continued)

OTHER PUBLICATIONS

International Search Report with English translation dated Sep. 20, 2011 (three (3) pages).

(Continued)

*Primary Examiner* — Mark Kopec
(74) *Attorney, Agent, or Firm* — Crowell and Moring LLP

(57) ABSTRACT

A conductive paste material containing a $SiO_2$–$B_2O_3$–ZnO–RO–$R_2O$ type lead-free low-melting-point glass that contains, by wt %, 2 to 10% of $SiO_2$, 18 to 30% of $B_2O_3$, 0 to 10% of $Al_2O_3$, 0 to 25% of ZnO, 20-50% of RO where RO represents one or more of MgO, CaO, SrO, and BaO, and 10 to 17% of $R_2O$ where $R_2O$ represents one or more of $Li_2O$, $Na_2O$, and $K_2O$.

7 Claims, 1 Drawing Sheet

(56) References Cited

FOREIGN PATENT DOCUMENTS

| | | |
|---|---|---|
| JP | 2005-219942 A | 8/2005 |
| JP | 2007-39269 A | 2/2007 |
| JP | 2007-59380 A | 3/2007 |
| WO | WO 2008/001631 A1 | 1/2008 |
| WO | WO 2008/007570 A1 | 1/2008 |

OTHER PUBLICATIONS

Form PCT/ISA/237 (three (3) pages).
European Search Report dated Mar. 14, 2014 (Eleven (11) pages).

* cited by examiner

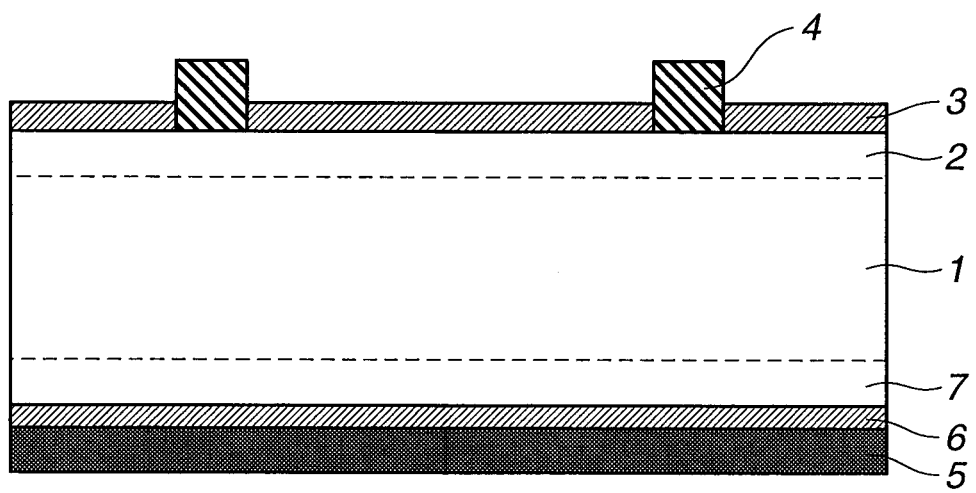

US 8,808,582 B2

LOW-MELTING-POINT GLASS COMPOSITION AND CONDUCTIVE PASTE MATERIAL USING SAME

TECHNICAL FIELD

The present invention relates to a low-melting-point glass composition that exhibits an excellent electrical characteristic when used in electrodes formed on a crystalline silicon solar battery and is suitable for a lead-free conductive paste material that exhibits an excellent adhesion to a silicon semiconductor substrate.

BACKGROUND ART

As an electronic part using a semiconductor silicon substrate, such a solar battery element as shown in FIG. 1 has been widely known. As is understood from FIG. 1, the solar battery element comprises a P-type semiconductor silicon substrate 1 having a thickness of about 200 μm, a N-type semiconductor silicon layer 2 formed on a light receiving surface of the substrate 1, an antireflective film 3 such as a silicon nitride film or the like formed on an outer surface of the light receiving surface for increasing a light receiving efficiency and surface electrodes 4 formed on the antireflective film 3 and connected to the semiconductors. On a back side of the P-type semiconductor silicon substrate 1, there is evenly formed an aluminum electrode layer 5.

Usually, for producing the aluminum electrode layer 5, an aluminum paste material consisting of aluminum powder, glass frit and organic vehicle that contains binder such as ethyl cellulose, acrylic resin or the like is applied to a given portion by a screen printing method, and thereafter, the applied aluminum paste material is subjected to a short time firing at a temperature of about 600 to 900° C.

Due to the firing of the aluminum paste, aluminum is diffused to the P-type semiconductor silicon substrate 1, and thus, a Si—Al eutectic layer called as BSF (viz., Back Surface Field) layer 6 is formed between the aluminum electrode layer 5 and the P-type semiconductor silicon substrate 1, and due to the diffusion of aluminum, an impurity layer P+ layer 7 is produced.

This P+ layer 7 functions to restrain the loss caused by rejoining of carriers produced by a photovoltaic effect of PN junction and contributes to increase the conversion efficiency of the solar battery element.

It has been disclosed (by for example Patent Documents 1 and 2) that a higher BSF effect can be obtained when glass having a lead contained therein is used as a glass frit contained in the aluminum paste.

PRIOR ART DOCUMENTS

Patent Documents

Patent Document 1: Japanese Laid-open Patent Application (Tokkai) 2007-59380
Patent Document 2: Japanese Laid-open Patent Application (Tokkai) 2003-165744

SUMMARY OF THE INVENTION

Problems to be Solved by the Invention

Although lead is an important component to cause glass to have a low melting point, the same has harmful effects on human body and environment. The glass frit disclosed by the above-mentioned Japanese Laid-open Patent Application (Tokkai) 2007-59380 and Japanese Laid-open Patent Application (Tokai) 2003-165744 is a substance that contains lead, which is undesirable.

Means for Solving the Problems

According to the present invention, there is provided a conductive paste material for a solar battery that uses a silicon semiconductor substrate, which is characterized in that a low-melting-point glass contained in the paste material has substantially no lead therein and is a $SiO_2$—$B_2O_3$—$ZnO$—$RO$—$R_2O$ type lead-free low-melting-point glass that contains, by wt %, 2 to 10% of $SiO_2$, 18 to 30% of $B_2O_3$, 0 to 10% of $Al_2O_3$, 0 to 25% of ZnO, 20-50% of RO(MgO+CaO+SrO+BaO), and 10 to 17% of $R_2O$ ($Li_2O$+$Na_2O$+$K_2O$).

Furthermore, the above-mentioned conductive paste material is characterized in that a thermal expansion coefficient of the lead-free low-melting-point glass at a temperature ranging from 30° C. to 300° C. is $(100\sim150)\times10^{-7}/°$ C. and a softening point of the glass is from 400° C. to 550° C.

Furthermore, there is provided a solar battery element which is characterized by using the above-mentioned conductive paste material.

Furthermore, there is provided a substrate for an electronic part, which is characterized by using the above-mentioned conductive paste material.

Effects of the Invention

By using a conductive paste material containing a lead-free low-melting point glass frit according to the present invention, a higher BSF effect can be obtained. Furthermore, an excellent adhesion to a silicon semiconductor substrate can be obtained. Furthermore, harmful effects on human body and environment can be avoided because substantially it does not contain lead.

BRIEF DESCRIPTION OF THE DRAWING

FIG. 1 is a schematically illustrated sectional view of a conventional crystalline Si solar battery cell.

EMBODIMENTS OF THE INVENTION

A conductive paste material according to the present invention contains, in addition to aluminum powder and organic vehicle that contains binder such as ethyl cellulose, acrylic resin or the like, a glass frit, which is characterized in that the glass frit has substantially no lead therein and is a $SiO_2$—$B_2O_3$—$ZnO$—$RO$—$R_2O$ type lead-free low-melting-point glass that contains, by wt %, 2 to 10% of $SiO_2$, 18 to 30% of $B_2O_3$, 0 to 10% of $Al_2O_3$, 0 to 25% of ZnO, 20-50% of RO(MgO+CaO+SrO+BaO), and 10 to 17% of $R_2O$ ($Li_2O$+$Na_2O$+$K_2O$).

In the glass frit of the present invention, $SiO_2$ is a glass forming ingredient and, when it exists with $B_2O_3$ that is the other glass forming ingredient, a stable glass can be produced. That is, $SiO_2$ is contained by an amount ranging from 2 to 10% (wt %, the same in the following). If it exceeds 10%, the softening point of the glass is raised and thus forming quality and working property are lowered. Preferably, the range is from 4 to 9%.

$B_2O_3$ is a glass forming ingredient and functions to ease glass melting, restrain excessive increase of the thermal expansion coefficient of glass, provide the glass with a suitable fluidity at the time of firing, and lower the dielectric constant of the glass. That is, $B_2O_3$ is contained in the glass by an amount ranging from 18 to 30%. If it is less than 18%, the fluidity of the glass becomes poor, and thus sinterability is spoiled. While, if it exceeds 30%, stability of the glass is lowered. Preferably, the range is from 19 to 29%.

$Al_2O_3$ is an ingredient that functions to restrain a crystallization of the glass and make the crystallization stable. Containing it in the glass by an amount ranging from 0 to 10% is preferable. If it exceeds 10%, the softening point of the glass is raised to such an extent as to lower the forming quality and working property.

ZnO is an ingredient that functions to lower the softening point of the glass. It is contained in the glass by an amount ranging from 0 to 25%. If it exceeds 25%, the glass becomes unstable and crystallization tends to occur. Preferably, the range is from 0 to 23%.

RO(MgO+CaO+SrO+BaO) is a group of ingradients that functions to lower the softening point of the glass to provide the glass with a suitable fluidity. It is contained in the glass by an amount ranging from 20 to 50%. If it is less than 20%, the lowering of the softening point of the glass is not sufficient and thus sinterability is spoiled. While, if it exceeds 50%, the thermal expansion coefficient of the glass is excessively increased. Preferably, the range is from 23 to 50%.

$R_2O$ ($Li_2O$, $Na_2O$, $K_2O$) is a group of ingradients that functions to lower the softening point of the glass to provide the glass with a suitable fluidity and adjust the thermal expansion coefficient to a suitable range. It is contained in the glass by an amount ranging from 10 to 17%. If it is less than 10%, the lowering of the softening point of the glass is not sufficient and thus sinterability is spoiled. While, if it exceeds 17%, the thermal expansion coefficient of the glass is excessively increased. Preferably, the range is from 12 to 17%.

If desired, CuO, $TiO_2$, $In_2O_3$, $Bi_2O_3$, $SnO_2$ and/or $TeO_2$, which are conventional oxides, may be added to the glass frit.

Because of non-use of PbO, harmful effects on human body and environment can be completely avoided. The non-use of PbO mentioned hereinabove includes a state in which an amount of PbO which is mixed in the glass materials as impurities. For example, if mixing of PbO in the low-melting-point glass is less than 0.3 wt %, the above-mentioned effects, that is, the harmful effects on human body, environment and insulation characteristic are sufficiently avoided and thus, in effect the harmful effects of PbO can be completely avoided.

The conductive paste material is a material which is characterized in that a thermal expansion coefficient of the lead-free low-melting-point glass at a temperature ranging from 30° C. to 300° C. is $(100~150) \times 10^{-7}/°$ C. and a softening point of the glass is from 400° C. to 500° C. If the thermal expansion coefficient is out of $(100~150) \times 10^{-7}/°$ C., problems, such as peeling off of the substrate and warping of the same, tend to occur at the time of producing electrodes. Preferably, the range is $(105~145) \times 10^{-7}/°$ C. If the softening point exceeds 500° C., sufficient fluidity is not obtained at the time of firing, which deteriorates the adhesion to the silicon semiconductor substrate. Preferably, the softening point is from 400° C. to 480° C.

According to the invention, there is provided a solar battery element which is characterized by using the above-mentioned conductive paste material.

According to the invention, there is provided a substrate for an electronic part, which is characterized by using the above-mentioned conductive paste material.

Embodiments

In the following, the present invention will be described with the aid of embodiments.

(Conductive Paste Material)

For preparation of glass powder, various inorganic materials were weighted and mixed to produce material batches that have respectively predetermined composition ratios as described in embodiments. Each material batch was put into a melting pot of platinum, and heated and melted at 1000 to 1300° C. for 1 to 2 hours in an electric furnace. With these steps, various glass bodies were produced, which have composition ratios of the embodiments 1 to 5 shown in Table-1 and those of the comparative examples 1 to 4 shown in Table-2. A part of each glass body was poured into a mold to produce a glass block and subjected to a thermal property test (thermal expansion coefficient, softening point). The rest of each glass body was shaped into flake by using a rapid cooling double roll machine, and applied to a crushing machine to be crushed into well-ordered powder of which mean diameter is 1 to 4 μm and maximum diameter is smaller than 10 μm.

Then, ethylcellulose as a binder, the above-mentioned glass powder and aluminum powder as a conductive powder were mixed, at a predetermined mixing ratio, with a paste oil including α-terpineol and butylcarbitolacetate. With this, a conductive paste having a viscosity of about 500±50 poise was produced in each embodiment and comparative example.

The softening point was measured by using a thermal analysis device "TG-DTA" (Product of Rigaku Co.,). For measuring the thermal expansion coefficient, a thermal expansion meter was used, and the coefficient was derived from an elongation that appeared when the paste was heated from 30° C. to 300° C. at a heating speed of 5° C./min.

Then, P-type semiconductor silicon substrates 1 were prepared, and the conductive paste thus produced in the above-mentioned manner was printed on the substrates by a screen printing method. The test pieces thus produced were dried in an oven at 140° C. for 10 minutes, and then fired or baked in an electric furnace at 800° C. for 1 minute. With this, there were produced test piece structures each having the P-type semiconductor silicon substrate 1 on which both an aluminum electrode layer 5 and a BSF layer 6 are formed.

Samples thus obtained in the above-mentioned manner were applied to a 4 probe type surface resistance measuring equipment to measure a surface resistance of each sample that effects an ohmic resistance between electrodes.

Then, in order to examine the adhesion of the aluminum electrode layer 5 to the P-type semiconductor silicon substrate 1, a mending tape (Product of Nichiban) was stuck to the aluminum electrode layer 5 and then peeled off from the layer 5. By viewing a peeled condition of the aluminum electrode layer 5 at the time when the tape was peeled off, visual evaluation of the state was made.

Thereafter, the P-type semiconductor silicon substrate 1 having the aluminum electrode layer 5 formed thereon was submerged into a sodium hydroxide aqueous solution to apply etching to both the aluminum electrode layer 5 and the BSF layer 6. With this, the $P^+$ layer 7 was exposed to the outer surface and a surface resistance of the $P^+$ layer 7 was measured by the 4 probe type surface resistance measuring equipment.

It is said that there is a correlation between the surface resistance of the $P^+$ layer 7 and the BSF effect, in which as the surface resistance of the $P^+$ layer 7 lowers, the BSF effect increases thereby increasing the conversion efficiency of a solar battery element. In the invention, a target value of the surface resistance of the $P^+$ layer 7 was equal to or lower than 25 Ω/□.

(Results)

Composition of the lead-free low-melting-point glass and various test results are shown in Tables.

TABLE 1

| | | EMBODIMENT | | | | |
|---|---|---|---|---|---|---|
| | | 1 | 2 | 3 | 4 | 5 |
| GLASS COMPOSITION [WT %] | $SiO_2$ | 9.3 | 2.9 | 2.5 | 7.8 | 8.3 |
| | $B_2O_3$ | 28.3 | 21.6 | 28.0 | 28.5 | 19.1 |
| | $Al_2O_3$ | | 3.5 | 1.5 | | 1.0 |
| | ZnO | 22.1 | 15.3 | 7.3 | | 24.0 |
| | MgO | | 2.5 | | | |
| | CaO | 3.1 | | 43.1 | 25.0 | 25.3 |
| | SrO | | | 3.5 | | 6.1 |
| | BaO | 21.1 | 39.8 | | 24.1 | |
| | $Li_2O$ | 1.5 | 1.3 | | | |
| | $Na_2O$ | 7.7 | 6.9 | | 13.5 | 5.5 |
| | $K_2O$ | 6.9 | 6.2 | 14.1 | 1.1 | 10.7 |
| THERMAL EXPANSION COEFFICIENT | $\times 10^{-7}$/° C. | 115 | 140 | 135 | 145 | 120 |
| SOFTENING POINT | ° C. | 475 | 420 | 430 | 460 | 435 |
| $P^+$ LAYER SURFACE RESISTANCE VALUE | $\Omega/\square$ | 23 | 22 | 21 | 21 | 22 |
| ADHESIVE STRENGTH | | ○ | ○ | ○ | ○ | ○ |

TABLE 2

| | | COMPARATIVE EXAMPLE | | | |
|---|---|---|---|---|---|
| | | 1 | 2 | 3 | 4 |
| GLASS COMPOSITION [WT %] | $SiO_2$ | 12.4 | 4.6 | 8.5 | 4.0 |
| | $B_2O_3$ | 31.2 | 38.9 | 31.2 | 32.3 |
| | $Al_2O_3$ | | | 1.0 | |
| | ZnO | 45.5 | 37.3 | 32.8 | 38.9 |
| | MgO | | | | |
| | CaO | | | 22.3 | |
| | SrO | | | | |
| | BaO | 1.5 | 6.5 | | 6.0 |
| | $Li_2O$ | | | | |
| | $Na_2O$ | 6.4 | 7.5 | | 3.8 |
| | $K_2O$ | 3.0 | 4.2 | 5.2 | 15.0 |
| THERMAL EXPANSION COEFFICIENT | $\times 10^{-7}$/° C. | 78 | 86 | 85 | DELIQESCENCE |
| SOFTENING POINT | ° C. | 550 | 534 | 589 | DELIQESCENCE |
| $P^+$ LAYER SURFACE RESISTANCE VALUE | $\Omega/\square$ | 40 | 45 | 38 | — |
| ADHESIVE STRENGTH | | Δ | ○ | X | — |

As is indicated in embodiments 1 to 5 of Table-1, in a composition range according to the invention, the softening point is from 400° C. to 500° C., an ideal thermal expansion coefficient ((100 to 150)×$10^{-7}$/° C.) is obtained and the adhesion to the P-type semiconductor silicon substrate 1 is excellent. Furthermore, the resistance value of the $P^+$ layer 7 that effects the conversion efficiency of the solar battery element is low and thus, the conductive paste of the invention is excellent as a conductive paste for a crystalline Si solar battery.

While, in case of comparative examples 1 to 4 shown in Table-2 which are out of the composition range of the invention, a sufficient adhesion to the P-type semiconductor silicon substrate 1 is not obtained, the resistance value of the $P^+$ layer 7 is high and the glass shows a deliquescence after being melted, which means that the comparative examples are not suitable as a conductive paste for the crystalline Si solar battery.

DESCRIPTION OF REFERENCES

1 . . . P-type semiconductor silicon substrate
2 . . . N-type semiconductor silicon substrate
3 . . . antireflective film
4 . . . surface electrode
5 . . . aluminum electrode layer
6 . . . BSF layer
7 . . . $P^+$ layer

The invention claimed is:

1. A conductive paste for a solar battery having a silicon semiconductor substrate provided therein, comprising:
   aluminum powder; and
   a low-melting-point glass having substantially no lead therein that is a $SiO_2$—$B_2O_3$—ZnO—RO—$R_2O$ type lead-free low-melting-point glass that contains, by wt %,
   2 to 10% of $SiO_2$,
   18 to 30% of $B_2O_3$,
   0 to 10% of $Al_2O_3$,
   0 to 25% of ZnO,
   20-50% of RO, wherein RO represents one or more of MgO, CaO, SrO and BaO, and
   10 to 17% of $R_2O$, wherein $R_2O$ represents one or more of $Li_2O$, $Na_2O$, and $K_2O$.

2. A solar battery element, comprising the conductive paste as defined in claim 1.

3. A low-melting-point glass, comprising:
   substantially no lead therein;
   2 to 10 wt % of $SiO_2$;
   18 to 30 wt % of $B_2O_3$;
   0 to 10 wt % of $Al_2O_3$;
   0 to 25 wt % of ZnO;
   20-50 wt % of RO, wherein RO represents one or more of MgO, CaO, SrO and BaO; and
   10 to 17 wt % of $R_2O$, wherein $R_2O$ represents one or more of $Li_2O$, $Na_2O$, and $K_2O$,
   wherein the low-melting-point glass has a thermal expansion coefficient at a temperature ranging between 30° C. and 300° C. of (100-150)×$10^{-7}$/° C. and a softening point between 400° C. and 550° C.

4. A conductive paste, comprising the low-melting-point glass as defined in claim 3.

5. A low-melting-point glass as claimed in claim 3, wherein the softening point is between 400° C. and 500° C.

6. A solar battery element, comprising the low-melting-point glass as defined in claim 3.

7. A substrate for an electronic part, comprising the low-melting-point glass as defined in claim 3.

* * * * *